(12) United States Patent
Kwean

(10) Patent No.: US 6,906,976 B2
(45) Date of Patent: Jun. 14, 2005

(54) AUTO REFRESH CONTROL CIRCUIT OF SEMICONDUCTOR MEMORY DEVICE

(75) Inventor: Ki Chang Kwean, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 165 days.

(21) Appl. No.: 10/608,858

(22) Filed: Jun. 30, 2003

(65) Prior Publication Data

US 2004/0125679 A1 Jul. 1, 2004

(30) Foreign Application Priority Data

Dec. 26, 2002 (KR) .............................. 10-2002-0084041

(51) Int. Cl.⁷ ............................................. G11C 11/00
(52) U.S. Cl. ............. 365/222; 365/230.06; 365/230.08; 365/227; 711/105; 711/106
(58) Field of Search .............................. 365/22, 230.06, 365/230.08, 227; 711/105, 106

(56) References Cited

U.S. PATENT DOCUMENTS

| | | | | |
|---|---|---|---|---|
| 5,787,457 A | * | 7/1998 | Miller et al. ................ | 711/105 |
| 5,940,342 A | * | 8/1999 | Yamazaki et al. ..... | 365/230.03 |
| 6,219,292 B1 | | 4/2001 | Jang | |
| 6,289,413 B1 | * | 9/2001 | Rogers et al. .............. | 711/105 |
| 6,292,420 B1 | | 9/2001 | Kim et al. | |
| 6,295,238 B1 | | 9/2001 | Tanizaki et al. | |
| 6,438,055 B1 | * | 8/2002 | Taguchi et al. ............. | 365/222 |
| 6,522,600 B2 | | 2/2003 | Ohshima et al. | |
| 6,721,223 B2 | * | 4/2004 | Matsumoto et al. ......... | 365/222 |
| 6,781,911 B2 | * | 8/2004 | Riesenman et al. ......... | 365/226 |
| 6,826,104 B2 | * | 11/2004 | Kawaguchi et al. ........ | 365/222 |
| 2001/0045579 A1 | * | 11/2001 | Ooishi et al. ............... | 257/222 |
| 2001/0048623 A1 | | 12/2001 | Tanizaki et al. | |
| 2002/0191467 A1 | * | 12/2002 | Matsumoto et al. ........ | 365/222 |
| 2003/0103368 A1 | * | 6/2003 | Arimoto et al. .............. | 365/63 |
| 2004/0027902 A1 | * | 2/2004 | Ooishi et al. ............... | 365/222 |
| 2004/0196728 A1 | * | 10/2004 | Matsuzaki ................... | 365/232 |

FOREIGN PATENT DOCUMENTS

| | | | | |
|---|---|---|---|---|
| JP | 11066842 A | * | 3/1999 | ......... G11C/11/403 |
| JP | 11-312386 | | 11/1999 | |
| JP | 2000-30439 | | 1/2000 | |
| JP | 2001-76500 | | 3/2001 | |

* cited by examiner

Primary Examiner—Viet Q. Nguyen
(74) Attorney, Agent, or Firm—Heller Ehrman LLP

(57) ABSTRACT

An auto refresh control circuit of a semiconductor memory device comprises a command decoder for generating an auto refresh signal performing an auto refresh operation; a wordline control means for activating wordlines when the auto refresh signal is activated, and for precharging the wordlines when an auto refresh operation is finished; and a buffer control means for inactivating the input buffers when the auto refresh signal is activated or a power down signal is activated, and for activating the input buffers when a signal detecting the end time of an auto refresh is activated. Accordingly, the auto refresh control circuit inactivates all of the buffers and input latches during the auto refresh operation, thereby reducing current consumption.

7 Claims, 5 Drawing Sheets

US 6,906,976 B2

AUTO REFRESH CONTROL CIRCUIT OF SEMICONDUCTOR MEMORY DEVICE

BACKGROUND OF THE INVENTION

1. Field of the Invention

The present invention relates to an auto refresh control circuit of a semiconductor memory device, more specifically, to an auto refresh control circuit for ceasing the operation of buffer during the auto refresh operation, thereby decreasing current consumption and minimizing power noise.

2. Description of the Related Art

Generally, a dynamic random access memory (DRAM) includes a capacitor as a unit memory device storing a data, which is called a cell. When a data of '1' (or 'high level') is stored in the cell, a high potential is applied to the cell, and when a data of '0' (or 'low level') is stored in the cell, a low potential is applied to the cell. In an ideal case, the capacitor constituting the cell maintains stored charges, so long as a potential of a connection terminal of the capacitor is not varied. However, actually, as the time elapses, the stored charges are lost as a leakage current. Accordingly, it is impossible to judge whether the recorded data is '1' or '0'. In order to constantly maintain the data, a process of periodically sensing and amplifying the data stored in the cell, and restoring it in the cell is necessary. The process is called a refresh operation.

The refresh operation of the DRAM is divided according to a performing method. The RAS only refresh operation consists of a cycle of externally applying a row address strobe signal and a row address on which the refresh operation is performed, raising a word line selected by the row address, amplifying and re-writing the data of the whole cells connected to the word line by a sense amplifier, and dropping the word line. In this case, in order to refresh the whole cells of the DRAM, all the row addresses must be externally inputted.

So as to overcome the aforementioned disadvantage, there has been suggested the auto-refresh operation (or CBR refresh: CAS before RAS refresh). The auto-refresh operation carries out the 'sensing-amplifying-restoring' operation, identically to the RAS only refresh operation. However, since the row addresses are sequentially generated inside, it is not necessary to externally input the row addresses.

FIG. 1 is a block diagram illustrating a conventional auto-refresh control circuit of a semiconductor memory device.

The auto refresh control circuit includes a clock enable signal buffer 1, a power-down detector 2, a clock buffer 3, a command buffer 4, a command decoder 5, an address buffer 6, an address latch 7, an active control unit 8, an auto refresh delay unit 9 and a wordline enable unit 10.

The clock enable signal buffer 1 buffers a clock enable signal CKE. When the clock enable signal CKE is disabled to a low level, the operation of buffers ceases.

The power-down detector 2 receives the clock enable signal CKE from the clock enable signal buffer 1, and outputs an enable signal EN for controlling the operation of buffers according to the status of the clock enable signal CKE.

The clock buffer 3 outputs a clock pulse signal CLKP by buffering the clock signal CLK externally inputted. The clock pulse signal CLKP operates as a trigger signal for other input signals (command and address signals).

The command buffer 4 outputs a command signal COM by buffering external control signals CS, RAS, CAS, WE.

The command decoder 5 detects the state of the command signal COM outputted from the command buffer 4 in synchronization with the clock pulse signal CLKP outputted form the clock buffer 3, and then outputs the operation command according to the detected result. Here, the operation command is an auto refresh command AREF for example.

The address buffer 6 buffers an address signal ADD externally inputted.

The address latch 7 latches an address signal INADD outputted from the address buffer 6, and then outputs an address signal ADDLAT latched at a rising edge of the clock pulse signal CLKP outputted from the clock buffer 3.

The active control unit 8 enables an active signal ACT when a row active command and refresh command are inputted, and enables a precharge signal PCG when a precharge command is inputted. For example, if an auto refresh command AREF is inputted, an active signal ACT is generated.

The auto refresh delay unit 9 delays the active signal ACT outputted from the active control unit 8 as long as a refresh operation is performed, and outputs a delay signal DEL.

The active control unit 8 generates a precharge signal PCG in response to the delay signal DEL.

When the wordline control unit 10 receives the active signal ACT, the wordline WL is enabled. When the wordline control unit 10 receives the precharge signal PCG, the wordline WL is precharged.

FIG. 2 is a timing diagram showing an operation of the auto refresh control circuit illustrated in FIG. 1.

During the refresh operation, any external command is not noticed. After the refresh operation is finished, an operation of chip is performed according to an external command.

The enable signal EN maintains the state of a high level during an auto refresh operation. When a power down entry is inputted, the enable signal EN becomes at a low level.

While the enable signal EN maintains the state of low level, all buffers cease their operation.

Generally, the buffers do not consume current when the states of the external input signals vary, but constantly consume current while they operate.

Accordingly, a conventional auto refresh control circuit of a semiconductor memory device constantly enables input buffers during the auto refresh operation such that the current consumption increases.

SUMMARY OF THE INVENTION

Accordingly, it is an object of the present invention to provide an auto refresh control circuit of a semiconductor memory device configured to disable input buffers, a command latch (command decoder) and an address latch when an auto refresh command is input, and to enable them when a precharge operation is enabled, thereby reducing current consumption during the auto refresh operation.

In order to achieve the above object of the present invention, an auto refresh control circuit of the present invention comprises a command decoder, a wordline control means, and a buffer control means. The command decoder generates an auto refresh signal performing an auto refresh operation. The wordline control means activates wordlines when the auto refresh signal is activated and precharges the wordlines when an auto refresh operation is finished. The buffer control means inactivates the input buffers when the auto refresh signal is activated or a power down signal is activated, and activates the input buffers when a signal detecting the end time of an auto refresh is activated. When the input buffers are inactivated, the command decoder and input latches are inactivated.

DETAILED DESCRIPTION OF THE PREFERRED EMBODIMENTS

The present invention will be described in more detail in reference to the accompanying drawings.

Figure 1:
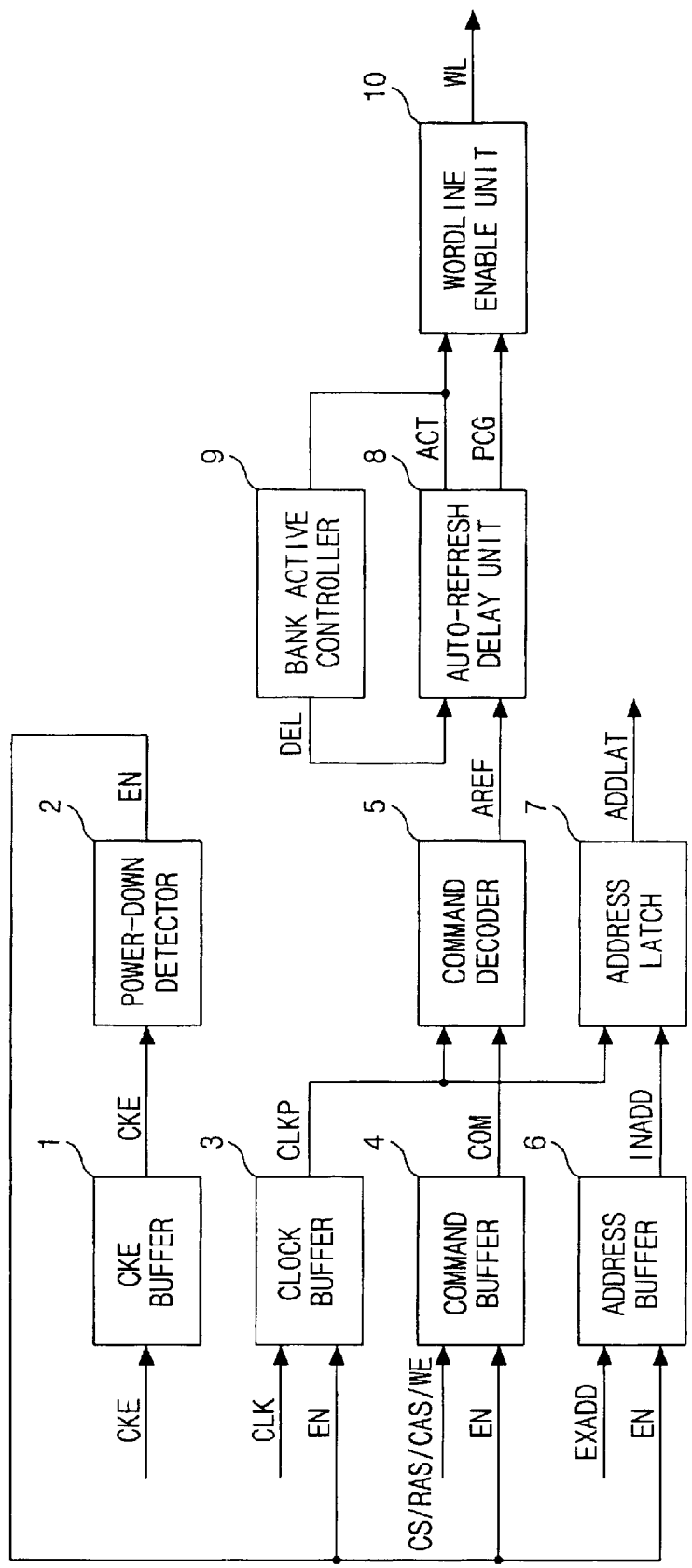
FIG. 1 is a block diagram illustrating an auto refresh control circuit of a conventional semiconductor memory device.
Figure 2:
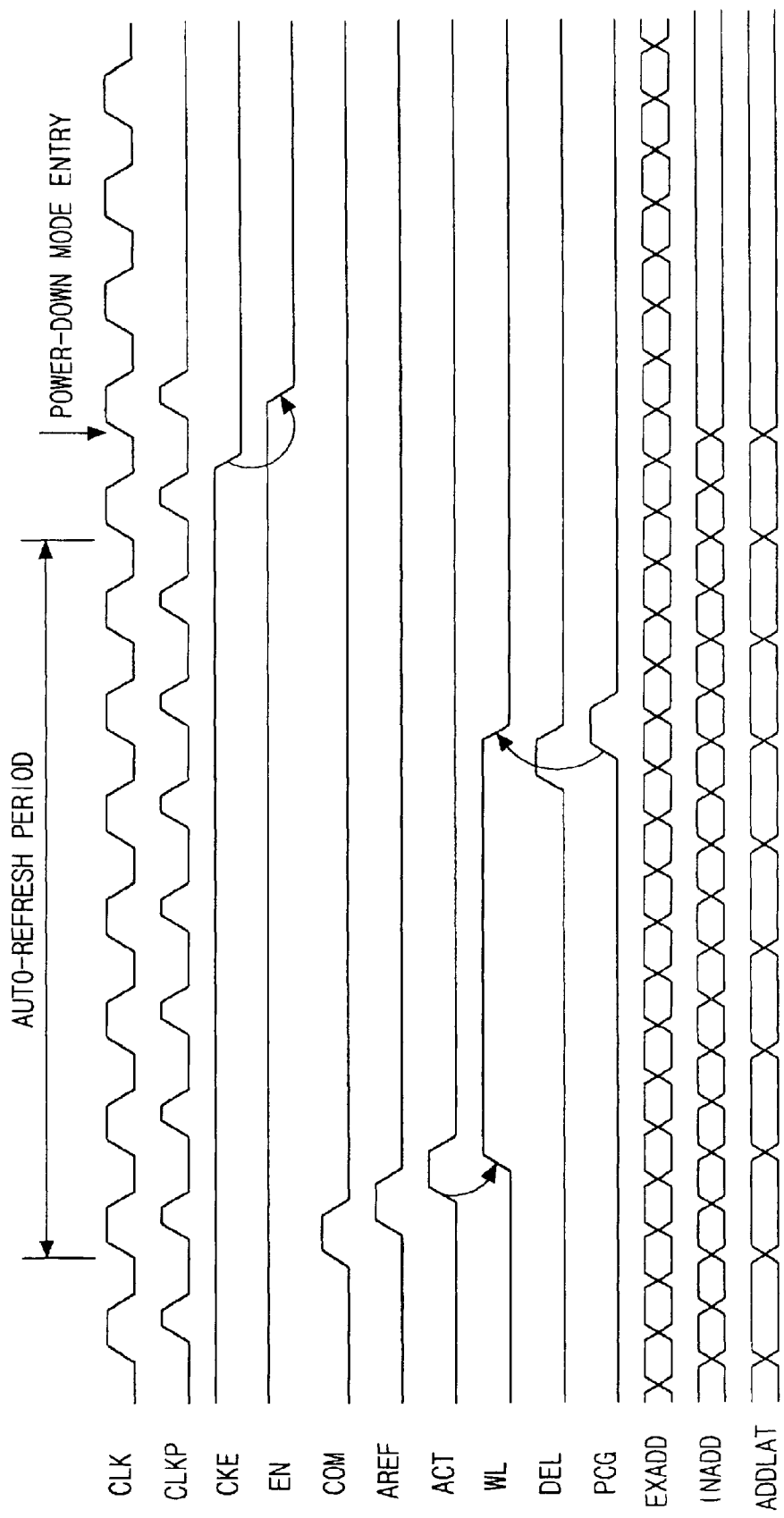
FIG. 2 is a timing diagram illustrating the operation of the auto refresh control circuit of FIG. 1.
Figure 3:
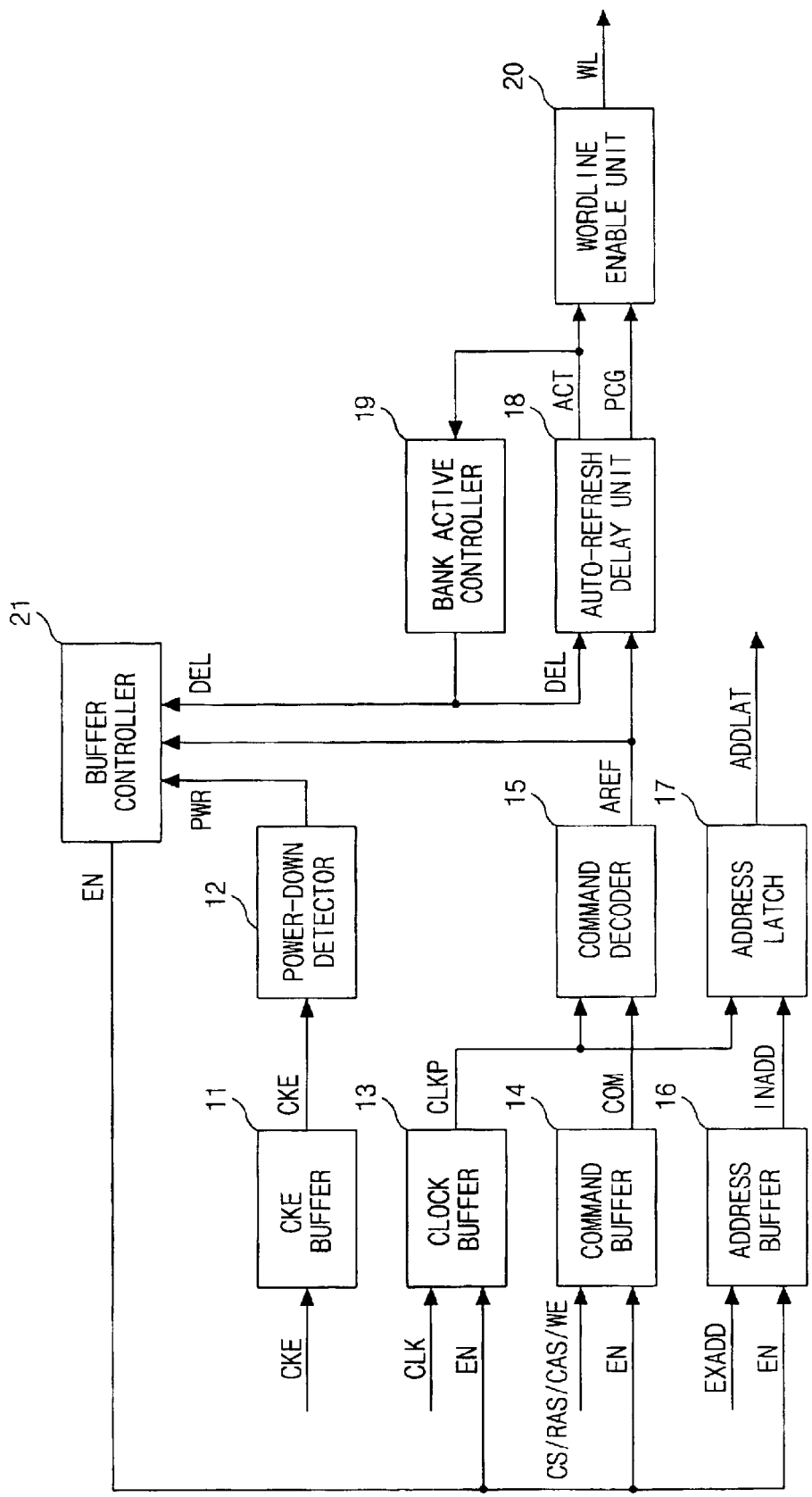
FIG. 3 is a block diagram illustrating an auto refresh control circuit according to the present invention.

FIG. 3 is a block diagram illustrating an auto refresh control circuit according to the present invention.

As shown in FIG. 3, the auto refresh control circuit comprises a clock enable signal buffer 11, a power down detector 12, a clock buffer 13, a command buffer 14, a command decoder 15, an address buffer 16, an address latch 17, an active control unit 18, an auto refresh delay unit 19, a wordline enable unit 20 and a buffer enable unit 21.

The clock enable signal buffer 11, the power down detector 12, the command buffer 14, the address buffer 16, the active control unit 18, the auto refresh delay unit 19 and the wordline enable unit 20 are well known. Accordingly, the detailed explanation of their constitution and operation is omitted.

The buffer enable unit 21 outputs an enable signal EN which controls input buffers 11, 13, 14, 16 by using a detecting signal PWR outputted from the power down detector 12, an auto refresh signal AREF outputted from the command decoder 15 and a delay signal DEL outputted from the auto refresh delay unit 19.

Figure 4:
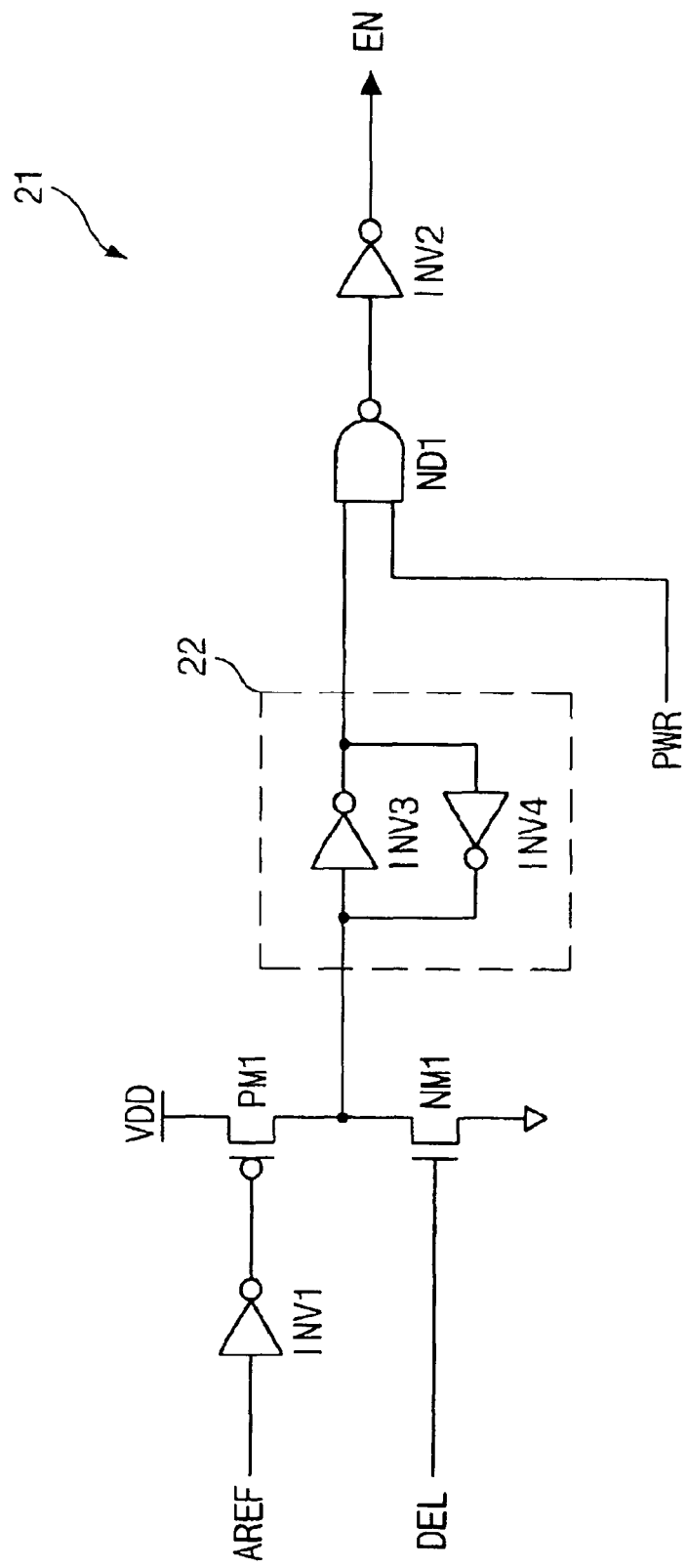
FIG. 4 is a detailed circuit diagram of a buffer enable unit of FIG. 3.

FIG. 4 is a detailed circuit diagram of a buffer enable unit of FIG. 3.

As shown in FIG. 4, the buffer enable unit 21 includes inverters INV1 and INV2, a NMOS transistor NM1 and a PMOS transistor PM1, a latch 22, a NAND gate ND1. The inverter INV1 inverts the auto refresh signal AREF. The NMOS transistor NM1 and the PMOS transistor PM1 connected in series between the power supply voltage VDD and the ground voltage VSS have their gates connected to receive the output signal from the inverter INV1. The latch 22 maintains the potential of common drain of the PMOS transistor PM1 and the NMOS transistor NM1. The NAND gate ND1 performs a NAND operation on the potential maintained by the latch 22 and the power down signal PWR. The inverter INV2 inverts the output signal from the NAND gate ND1 and outputs the enable signal EN. The latch 22 includes inverters INV3, INV4 having input terminals to receive the output signal from each other.

The buffer enable unit 21 can use the precharge signal PCG instead of the delay signal DEL.

Figure 5:
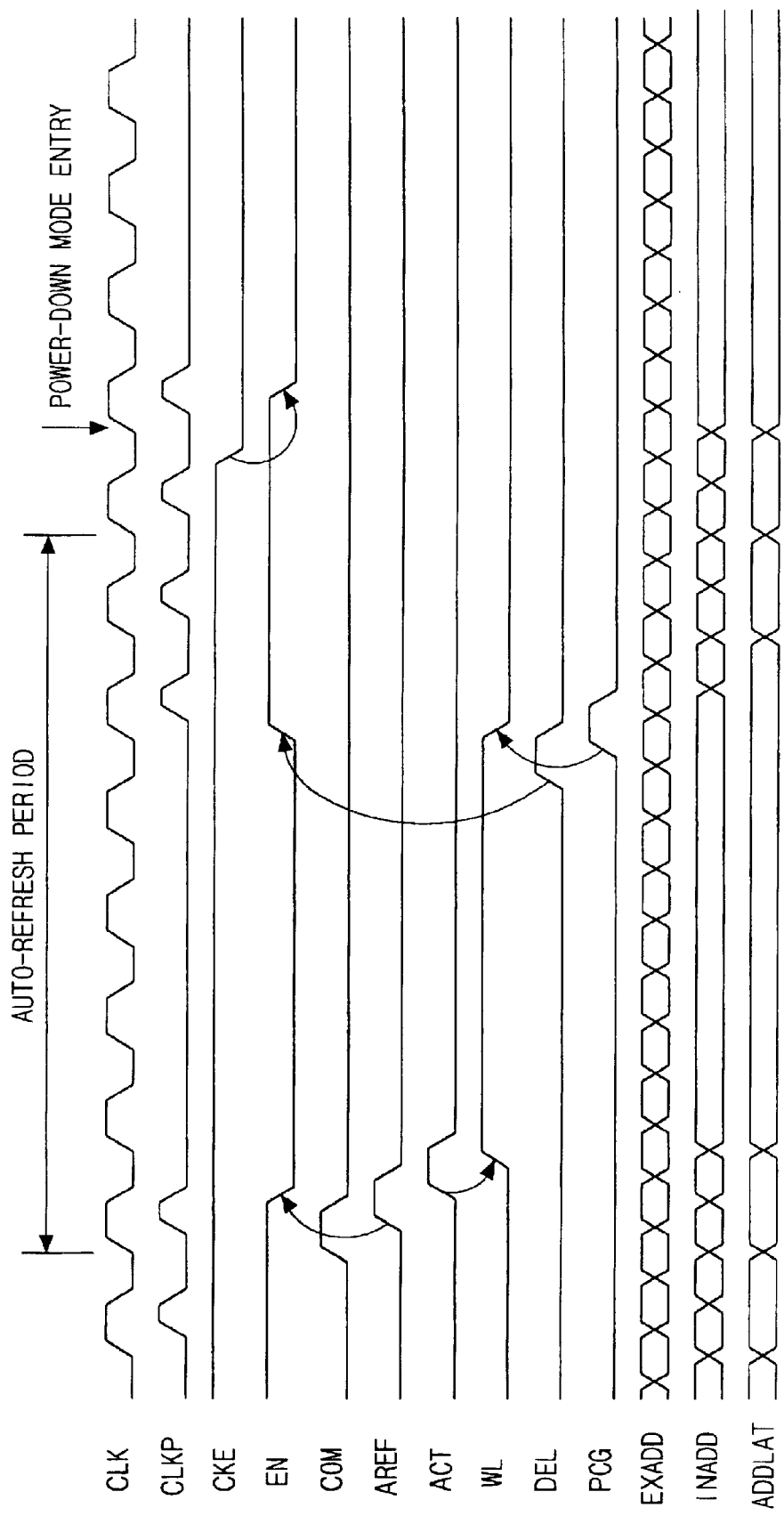
FIG. 5 is a timing diagram illustrating the operation of the auto refresh control circuit of FIG. 3.

Referring to FIG. 5, the enable signal En is at a low level during the auto refresh operation. As a result, the operation of the input buffers 11, 13, 14, and 16 is ceased.

That is, if the auto refresh signal AREF is at a high level, the enable signal EN becomes at a low level. The active signal ACT is delayed by the auto refresh delay unit 19 as long as the region of auto refresh operation. If the signal DEL delayed by the auto refresh delay unit 19 is at a high level, the enable signal EN becomes at a high level.

On the other hand, if the power down mode begins, the power down signal PWR from the power down detector 12 becomes at a low level. Accordingly, the enable signal EN becomes at a low level again such that the operation of all the input buffers 11, 13, 14, 16 ceases.

Accordingly, since the enable signal EN is at a low level during the auto refresh operation or when the power down mode begins, the operation of all input buffers 11, 13, 14, 16 ceases, thereby reducing the current consumption.

In addition, when the enable signal EN is at the low level, the clock buffer 13 is inactivated. Since the clock pulse signal CLKP is inactivated to a low level, the operation of the command decoder (command latch) 15 and the address latch 17 ceases, thereby reducing the current consumption.

As discussed earlier, the auto refresh control circuit of the semiconductor memory device according to the present invention ceases the operation of all of the input buffers and the input latches during the auto refresh operation, thereby reducing power consumption.

Also, the auto refresh control circuit of the present invention reduces current consumption during the auto refresh operation, thereby minimizing the power noise to improve the efficiency of the auto refresh operation.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. An auto refresh control circuit of a semiconductor memory device, comprising:

a command decoder for generating an auto refresh signal performing an auto refresh operation;

a wordline control means for activating wordlines when the auto refresh signal is activated, and for precharging the wordlines when an auto refresh operation is finished; and a buffer control means for inactivating the input buffers when the auto refresh signal is activated or a power down signal is activated, and for activating the input buffers when a signal detecting the end time of an auto refresh is activated, wherein when the input buffers are inactivated, the command decoder and input latches are inactivated.

2. The circuit according to claim 1, wherein the signal detecting the end time of the auto refresh is a signal for activating the wordlines when the auto refresh signal is activated, the signal delayed during the auto refresh operation.

3. The circuit according to claim 1, wherein the command decoder and input latches are controlled by a clock signal outputted from a clock buffer among the input buffers.

4. The circuit according to claim 1, wherein the signal detecting the end time of the auto refresh is a precharge signal for precharging the wordlines.

5. The circuit according to claim 1, wherein the buffer control means includes:

a pull-up means for pulling up an output terminal when the auto refresh signal is activated; and a pull-down means for pulling down the output terminal when the signal detecting the end time of the auto refresh is activated.

6. The circuit according to claim 5, wherein the buffer control means further includes a latch means for maintaining a potential of the output terminal.

7. The circuit according to claim 6, wherein the buffer control means further includes a logic means for inactivating the input buffers irrespective of the potential of the output terminal, when the power down signal is activated.

* * * * *